United States Patent [19]

Utner et al.

[11] 4,342,020
[45] Jul. 27, 1982

[54] ELECTRICAL NETWORK

[75] Inventors: Ferdinand Utner; Harald Vetter, both of Regensburg; Ludwig Nutz, Heidenheim, all of Fed. Rep. of Germany

[73] Assignee: Siemens Aktiengesellschaft, Berlin & Munich, Fed. Rep. of Germany

[21] Appl. No.: 138,708

[22] Filed: Apr. 9, 1980

[30] Foreign Application Priority Data

Apr. 23, 1979 [DE] Fed. Rep. of Germany ....... 2916329

[51] Int. Cl.³ .......................................... H01C 1/012
[52] U.S. Cl. .................................. 338/314; 338/308; 338/322; 338/325; 338/275
[58] Field of Search .............................. 338/307–309, 338/314, 322, 324, 325, 275; 29/610; 427/102, 103, 123–126

[56] References Cited

U.S. PATENT DOCUMENTS

| | | |
|---|---|---|
| 3,063,031 | 11/1962 | Edwards et al. ..................... 338/275 |
| 3,219,480 | 11/1965 | Girard ............................. 338/322 X |
| 3,296,574 | 1/1967 | Tassara ................................. 338/309 |
| 3,497,859 | 2/1970 | Bang ..................................... 338/309 |
| 3,569,668 | 3/1971 | Carlisle ................................ 219/312 |
| 4,115,750 | 9/1978 | Hansen et al. ................. 338/309 X |
| 4,119,937 | 10/1978 | Melvin .................................. 338/308 |

FOREIGN PATENT DOCUMENTS

| | | |
|---|---|---|
| 708273 | 7/1941 | Fed. Rep. of Germany ...... 338/314 |
| 2641310 | 3/1978 | Fed. Rep. of Germany . |

Primary Examiner—C. L. Albritton
Attorney, Agent, or Firm—Hill, Van Santen, Steadman, Chiara & Simpson

[57] ABSTRACT

A mechanically stable electrical network has a metal carrier and an insulating layer which supports the electrical network on the metal carrier.

10 Claims, 6 Drawing Figures

ELECTRICAL NETWORK

BACKGROUND OF THE INVENTION

1. Field of the Invention

The present invention relates to an electrical network which it contains, at least resistance layers and conductive paths and terminal elements materially bonded thereto, whereby the resistance layers, conductive paths and terminal elements are materially connected to a flexible carrier layer.

2. Description of the Prior Art

Such a network as generally described above is known from the German Offenlegungsschrift No. 2,641,310. Serving as a carrier in that publication is a synthetic layer on which metal layers are hot-pressed on both sides, whereby at least one of the metal layers consists of a plurality of layers from which resistors and conductive paths are formed.

Such networks can only be manufactured with relatively wide resistance layers and paths, since the synthetic layers are subjected to significant stresses when the structures are generated, such stresses leading to a mechanical destruction of narrow metal layers on the synthetic layer. This even applies given a strengthening of known networks by means of bonding an additional carrier consisting, for example, of resin bonded paper.

SUMMARY OF THE INVENTION

The object of the present invention is to provide, given an electrical network of the type generally mentioned above, even finer structures of resistance layers and conductive paths which are generated on a carrier layer and to provide mass production in the tape method with a high yield.

The above object is achieved in that the carrier is a metal layer, in that an insulating layer which is temperature-resistant at least up to 200° C. is arranged between the resistance layer or, respectively, the conductive paths and the terminal lines, and in that all layer are materially bonded to one another.

Such a structure has a high tensile strength, so that the mechanical stresses in manufacture, as well as in employment of the circuits, cannot lead to a destruction of narrow resistance layers or conductive paths.

If terminal elements lying in close proximity are to be applied, then it is advantageous when synthetic layers are bonded on both sides to a metal layer, when a sample of a resistor layer of nickel/chromium is first applied on at least one side and the sample of a copper layer is applied thereover, when terminal lugs in the area of the terminal lines of the network are inserted over the edges of the layer packet thus formed, and when the network is encapsulated with a synthetic material. The terminal lugs can be designed relatively narrow, their thickness being freely selectable. This solution is advantageous because the terminal lugs can be soldered on all sides. In addition to the insensitivity to contact required for the stress until incorporation, the synthetic encapsulation also guarantees the mechanical stability of the terminal lugs to the network as required in application. The terminal lugs are advantageously soldered to the terminal lines.

A simple format and a particularly secure contacting are provided in that plugs are formed on the carrier layer, in that at least one part of the plugs formed on the carrier layer is insulated from the current-conducting parts of the network, and in that the contact surfaces separated by a layer of insulating material from the plugs are separately arranged on the plugs. The layer of insulating material can be bonded on both sides of the metal layer in the form of a foil before the plugs are stamped out. In this case, it is to be recommended that the contact surfaces not extend up to the edges of the plugs. An even better contacting of the contact surfaces is achieved in that the plugs are encapsulated by synthetic material on all sides and in that the contact surfaces extend around the plugs.

Aluminum sheet is particularly suited as the carrier material or, for particularly high requirements of mechanical stability, steel sheet.

An execution which can be particularly rationally manufactured is given in that the carrier consists at least partially of solderable metal and that a synthetic layer is materially bonded on both surfaces to metal layers and is soldered onto the carrier. By doing so, no errors can occur in the circuit due to the hardening of the adhesive. A particularly rational manufacture of this embodiment is rendered possible since no hardening segments or re-hardening processes are required. A particularly good thermal contact between the foil and the carrier render possible a high thermal load of the lines of the network. No contamination of the foil and of the system due to resin occurs during manufacture. In the following, the described type of connection by means of soldering is designated as "solder lamination".

Such a solder lamination is advantageously carried out in that the layers of the network are applied to a first side of the synthetic layer and the second side is completely covered by a layer of the solderable metal and in that this layer of solderable metal is soldered to the carrier over its entire surface.

It is advantageous for the manufacture of high piece numbers of identical networks when the carrier is a metal layer coated on at least one side with lacquer and when the electrically conductive layers of the network are applied to the lacquer without employing an adhesive layer. This can occur, for example, by means of vapor deposition or by sputtering. The vapor-deposited layers or sputtered layers are then advantageously galvanically strengthened, insofar as a high conductivity is desired. What is meant by sputtering is the manufacture of a layer by means of cathode evaporation in a vacuum.

An advantageous method for manufacturing an electrical network, in accordance with the present invention, and in accordance with the tape method, is characterized by the following sequence of method steps:

(a) coating of a metal layer suitable for the formation of the conductive paths with a resistant layer, a layer of insulating material temperature-resistant up to more than 200° C., and, if needed, a further metal layer consisting of solderable metal;

(b) material bonding of the metal layer to a carrier layer of metal;

(c) etching, particularly selective etching of the layers of the network, whereby the carrier is coated before the etching with a protective layer that keeps the etching fluid out;

(d) stabilization of the resistance layers by means of tempering at at least approximately 200° C.; and (e) encapsulation of the network with a synthetic material.

In the method set forth above, the sensitive, thin resistance layers, which preferably consist of chromium/nickel, are mechanically protected during the laminating process by means of the layer provided for the conductive paths which is designated relatively thickly and preferably consist of copper. In the etching process, these layers are already materially bonded to the carrier. This is essential, since patterns are now etched into the layer provided for the conductive paths; it therefore no longer serves as a protection, in contrast thereto, it now forms areas with sharp edges which, due to the relative thickness of this layer, are able to damage or destroy the resistance layer given mechanical stresses. This damage to or destruction of the resistance layer is avoided in the proposed method by the stiffening effect of the carrier layer.

By selective etching, what is meant here is that, for example, upon employment of a metal layer consisting of copper and a resistance layer consisting of chromium/nickel, patterns are first etched into the metal layer which correspond to the latter, as insulating zones. Subsequently, the resistance layers now free from the metal layer are etched away, not, however, the still extant parts of the metal layer. Subsequently, the parts of the metal layer still extant are etched away down to the conductive paths or, respectively, contact surfaces required in the circuit, not, however, the resistant layer lying thereunder.

During these etching operations, the carrier of the layer must be coated with a protective layer keeping the etching fluid out so that the etching bath does not loose its effectiveness too quickly. Insofar as contacting by means of terminal lugs is provided, this protective layer must be temperature-resistant up to more than 200° C. so that it is not destroyed in the subsequent stabilization of the resistance layer. Such could lead to short circuits between the terminal lugs. Insofar as contacting occurs by way of formed-on plugs, a less temperature-resistant protective layer can be employed, at least in the area beyond the plugs on the side of the carrier facing away from the network. A destruction of the protective layer during stabilization does not have a negative effect on the quality of the network.

The encapsulation of the network advantageously occurs by means of dusting and with melting on synthetic material, for example, in an electrical field, i.e. by means of whirl sintering which is known per se. Thereby, the synthetic material dusted on is advantageously removed from the contact surfaces on the plugs before the synthetic material is melted smooth.

If contact terminal lugs are to be employed, then these are attached before encapsulation. The parts not to be encapsulated are expediently protected by means of adhesive strips.

For a function balancing after the encapsulation, it is advantageous when a synthetic material which is permeable to laser light is employed as the encapsulation, at least partially, namely, in the area of the components to be balanced, and when the network is balanced after encapsulation by means of a laser. By doing so, influences of the encapsulation on the balancing are compensated.

A particularly spaced-saving format is provided in that the metal layer coated with the resistance layer, the metal layer also being designated as the network layer, is folded around the carrier layer and is materially bonded to the carrier layer on both sides. A particularly small format with a large number of plugs is provided in that plugs are formed onto the carrier layer on both sides, in that the network is bent, and in that the plugs are bent into directions which are parallel to one another. This embodiment is particularly advantageous given a predetermined, narrow modular dimension, when there is space available above, the space above, for example, being determined by the height of neighboring components on a printed card.

The embodiment with the plugs formed on is advantageously manufactured in that plugs are first formed onto a carrier layer, in that the carrier layer is then lacquered on all sides, in that the lacquer is dried, in that the metal layers are applied without masking the plugs, in that the patterns are selectively etched, and in that the network is encapsulated with the plugs remaining exposed.

By so doing, the carrier layer is covered with lacquer on all sides; during vapor deposition, in addition to the directly vapor-deposited plug side, at least the narrow sides are likewise vapor-deposited. Given an appropriate arrangement, metal vapor is also deposited on the backside. Therefore, a plug which is conductive on all sides is produced, rendering possible a particularly secure contacting. The metal layers are advantageously vapor desposited. In the area of the plugs, a galvanic strengthening of the metal layers is expediently and additionally carried out.

Polyimide is particularly suited as the material for the layer of insulating material which is temperature-resistant over 200° C. This can be employed both as a foil and in a dissolved form as a lacquer for the exemplary embodiments of the invention described herein.

The copper layer coated with the resistance layer should have a minimum thickness of 3 $\mu$m in order to exhibit the necessary strength.

Under certain conditions, tinned sheet copper or tinned sheet steel are particularly suited for the solder lamination.

A resin which is permeable to the laser light is advantageously employed for the encapsulation material, so that a function balancing by means of a laser after the encapsulation is possible without problems.

Terminal lugs formed onto the carrier layer can be bent in the transverse direction before being coated with lacquer, so that they form terminal pins with, for example, an approximately annular cross-section. After the lacquering, this can be metallized on all sides in the manner described.

Due to the good heat dissipation of the proposed carrier layers of metal, the chrominum/nickel layers can be more highly thermally loaded than in the prior art. This produces a diminution of the networks and, therefore, a smaller expense. Moreover, the scatterings of the resistance values of the proposed resistor networks are noticeably narrower than in the networks according to the prior art.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
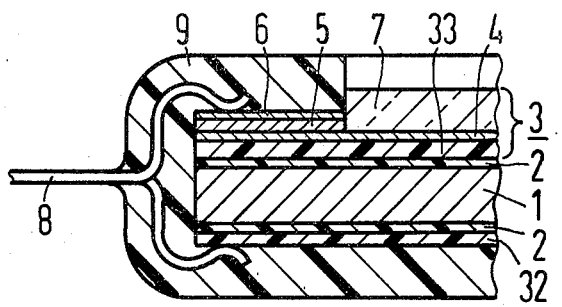
FIG. 1 illustrates, in a partial fragmentary and sectional view, a network constructed in accordance with the present invention illustrating terminal lugs.

Referring to FIG. 1, a network layer 3 is bonded onto one surface of a metal layer 1 by means of a high-temperature resistant adhesive layer 2. The network layer 3 contains a synthetic layer 33 to which a resistor layer 4, terminal lines 5, a tin layer 6 and a transparent lacquer layer 7 are materially bonded.

On the opposite side of the metal layer 1, a synthetic layer 32 is provided, which is preferably polyimide, and is bonded to the metal layer 1 by means of an adhesive layer 2 consisting of a high-temperature resistant adhesive. A terminal lug 8 encompasses the edge of the layer sequence which has arisen and contacts the tin layer 6 and is preferably soldered thereto. A synthetic encapsulation 9 encapsulates the network with the exception of an additional, transparent lacquer layer 7.

Figure 2:
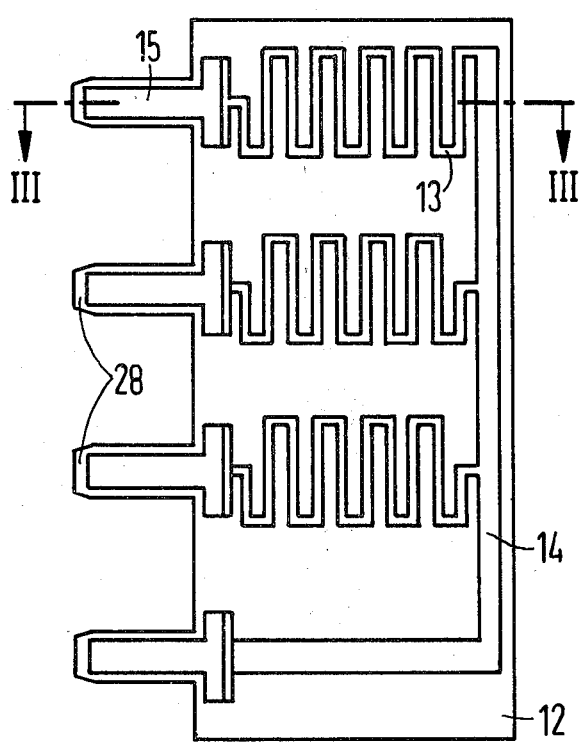
FIG. 2 is a plan view of a network with plugs formed thereon and without encapsulation.
Figure 3:
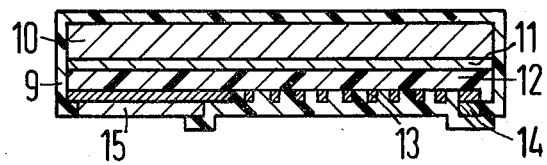
FIG. 3 is a cross-sectional view through a network of the type illustrated in FIG. 2, taken generally along the parting line III—III.

Referring now to FIGS. 2 and 3, a plurality of plugs 28 are formed onto a carrier layer 10 of metal, on which carrier layer 10 a synthetic layer 12 is bonded by means of a high-temperature resistant adhesive layer 11. The synthetic layer 12 is temperature-resistant at least up to 200° C.. Materially bonded to the synthetic layer 12 is a patterned resistor layer 13 and, above the layer 13, a patterned metal layer. The patterned metal layer preferably consists of copper and forms a terminal line 14 and contact surfaces 15. With the exception of the contact surfaces 15, the network described is encapsulated on all sides by a synthetic layer 9.

Figure 4:
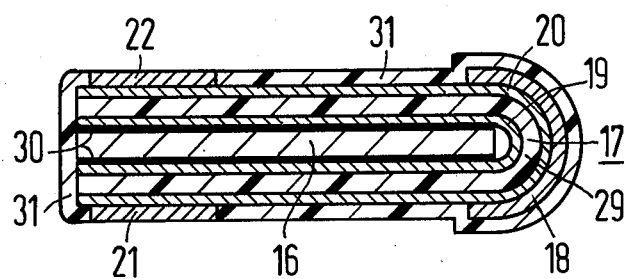
FIG. 4 is a sectional view of a network layer which is folded around the carrier layer and is connected to the carrier layer by means of solder lamination.

Referring to FIG. 4, a network layer 17 is soldered onto a carrier layer 16 consisting of a solderable metal, for example, consisting of copper or tinned iron, the network layer 17 being folded about the carrier layers 16 and again soldered to the carrier layer 16 at its backside. The network layer 17 here consists of high-temperature resistant synthetic material 29 which is coated over its entire surface on one side with a solderable metal layer 19, whereas a patterned layer resistor 20 and a patterned metal layer 18 arranged thereon are situated on the other side.

The carrier layer 16 is covered over its entire surface on both sides with tin layers 30, so that a thermal treatment without the addition of further solder suffices for the lamination. Instead of, or in addition to, the carrier layers 16, the solderable metal layer 19 can also be coated over its entire surface with a tin layer. The network is protected by means of a synthetic encapsulation 31 which completely encapsulates the network, with the exception of the contact surfaces 21 and 22. A solder lamination of the type described can also occur only on one side of the solderable metal carrier in the same manner.

Figure 5:
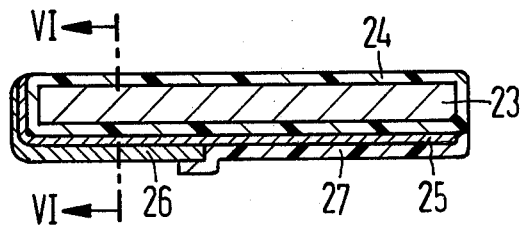
FIG. 5 is a sectional view of a network having a metal layer lacquered on all sides as a carrier.

A carrier layer 23 of metal (FIG. 5 and FIG. 6) is covered on all sides with a lacquer layer 24 consisting of a high-temperature resistant lacquer, particularly polyimide lacquer. A patterned resistor layer 25 and a patterned metal layer are applied to the lacquer layer 24. The patterned metal layer forms contact surfaces 26.

Figure 6:
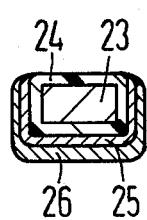
FIG. 6 is a cross-sectional view through the network illustrated in FIG. 5, taken generally along the parting line VI—VI.

Before lacquering, at least two plugs are formed onto the carrier layer 23. One of these plugs is illustrated in FIG. 6 in cross-section. The resistor layer 25 and the contact surfaces 26 extend around the edges of the plug. By so doing, a sufficient contacting is guaranteed, even given small dimensions of the plug. The network is protected by means of a synthetic layer 27, at least in the area in which the thin and sensitive resistor layer 25 is exposed.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. An electrical network comprising: a metal carrier; a pair of insulating layers materially bonded to opposite sides of said carrier, said insulating layers being temperature resistant up to at least 200° C.; a nickel/chromium resistance layer, conductive paths and terminal elements materially bonded to said insulating layers, said terminal elements located adjacent an edge of the network contacting said conductive paths; and a copper layer carried on said resistance layer.

2. The electrical network of claim 1, comprising: a lacquer covering at least one surface of said carrier and carrying said resistance layer and the conductive elements.

3. The electrical network of claim 1, wherein said terminal elements are soldered to said conductive paths.

4. The electrical network of claim 1, wherein said carrier includes plugs projecting therefrom one of, said insulating layer covering said plugs and carrying at said plugs, said terminal elements.

5. The electrical network of claim 4, wherein said terminal elements have distant ends which are spaced from the distant ends of said plugs.

6. The electrical network of claim 4, wherein one said insulating layer extends about all sides of said plugs and said terminal elements extend over a surface and the two adjacent edges of respective plugs.

7. The electrical network of claim 1, wherein said carrier comprises aluminum.

8. The electrical network of claim 1, wherein said carrier comprises steel.

9. The electrical network of claim 1, wherein said carrier comprises a solderable metal, and said insulating layers are formed of a single layer folded about said carrier, and metal layers on the surfaces of said insulating layer, one of which is soldered to said carrier.

10. The electrical network of claim 1, wherein said insulating layers are formed of a continuous layer folded about said carrier and which carries said resistance layer and the conductive elements on one surface and carries a solderable metal layer on its other surface which extends about and is soldered to both surfaces of said carrier.

* * * * *